US008957485B2

(12) United States Patent
Lacey

(10) Patent No.: US 8,957,485 B2
(45) Date of Patent: Feb. 17, 2015

(54) FABRICATION OF MEMS BASED CANTILEVER SWITCHES BY EMPLOYING A SPLIT LAYER CANTILEVER DEPOSITION SCHEME

(75) Inventor: Joseph Damian Gordon Lacey, Milpitas, CA (US)

(73) Assignee: Cavendish Kinetics, Ltd., San Jose, CA (US)

( * ) Notice: Subject to any disclaimer, the term of this patent is extended or adjusted under 35 U.S.C. 154(b) by 1277 days.

(21) Appl. No.: 12/357,340

(22) Filed: Jan. 21, 2009

(65) Prior Publication Data

US 2010/0181631 A1 Jul. 22, 2010

(51) Int. Cl.
*H01L 29/84* (2006.01)
*B81B 3/00* (2006.01)
*H01L 41/09* (2006.01)

(52) U.S. Cl.
CPC ........... *B81B 3/007* (2013.01); *B81B 2201/014* (2013.01); *B81B 2203/0118* (2013.01); *H01L 41/094* (2013.01)
USPC ............. 257/415; 257/E21.002; 257/E29.324

(58) Field of Classification Search
USPC ........................... 257/415, E21.002, E29.324
See application file for complete search history.

(56) References Cited

U.S. PATENT DOCUMENTS

| 5,677,823 A | 10/1997 | Smith |
| 5,917,226 A * | 6/1999 | Chan et al. ........... 257/415 |
| 6,115,231 A | 9/2000 | Shirakawa |
| 6,229,683 B1 | 5/2001 | Goodwin-Johansson |
| 6,509,605 B1 | 1/2003 | Smith |
| 6,566,617 B1 | 5/2003 | Suzuki et al. |
| 7,586,387 B2 * | 9/2009 | Van Delden ........... 333/101 |
| 2004/0159532 A1 | 8/2004 | Tatic-Lucic et al. |
| 2004/0188785 A1 | 9/2004 | Cunningham et al. |
| 2005/0164127 A1 | 7/2005 | Reid et al. |
| 2005/0237127 A1 | 10/2005 | Van Delden |
| 2007/0004096 A1 | 1/2007 | Heuvelman |
| 2007/0223267 A1 | 9/2007 | Kazinczi |

FOREIGN PATENT DOCUMENTS

CN 1898150 A 1/2007
WO WO-00-38208 A1 6/2000

OTHER PUBLICATIONS

Search Report and Written Opinion for PCT/US2010/021517 (CK058PCT) dated Jan. 25, 2011.
Office Action for Chinese Patent Application No. 201080005060.2 (CK058CN) dated Sep. 30, 2013.

* cited by examiner

*Primary Examiner* — Timor Karimy
(74) *Attorney, Agent, or Firm* — Patterson & Sheridan, LLP

(57) ABSTRACT

Embodiments discussed herein generally disclose novel alternative methods that can be employed to overcome the gradient stress formed in refractory materials to be used for thin film MEMS cantilever switches. The use of a 'split layer' cantilever fabrication method, as described herein enables thin film MEMS cantilever switches to be fabricated resulting in low operating voltage devices while maintaining the mechanical rigidity of the landing portion of the final fabricated cantilever switch.

19 Claims, 10 Drawing Sheets

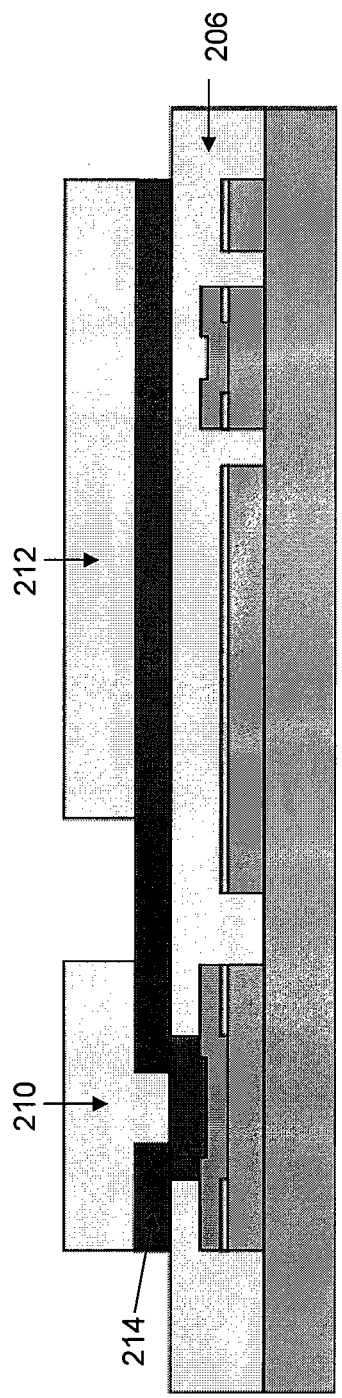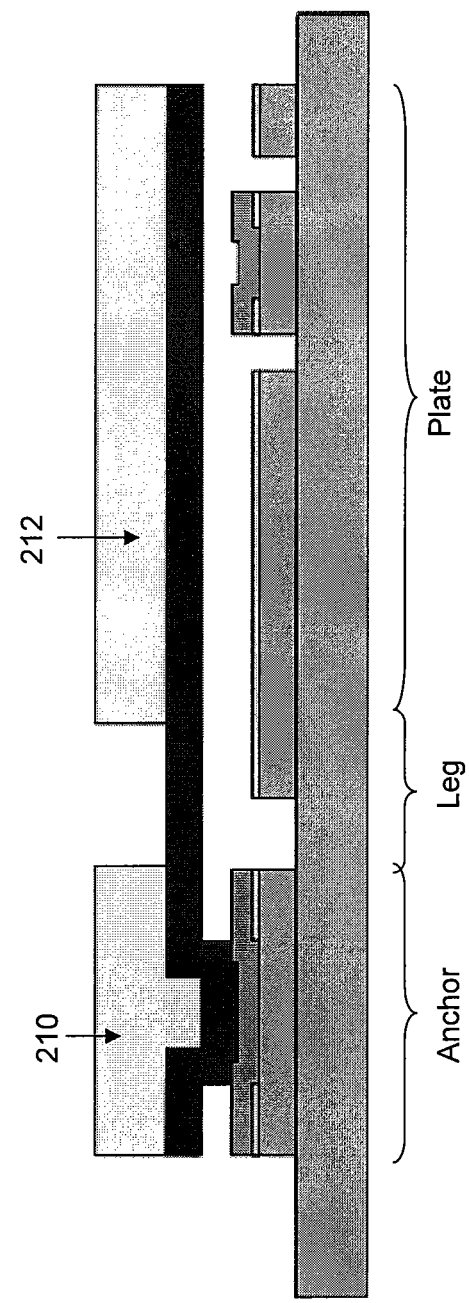

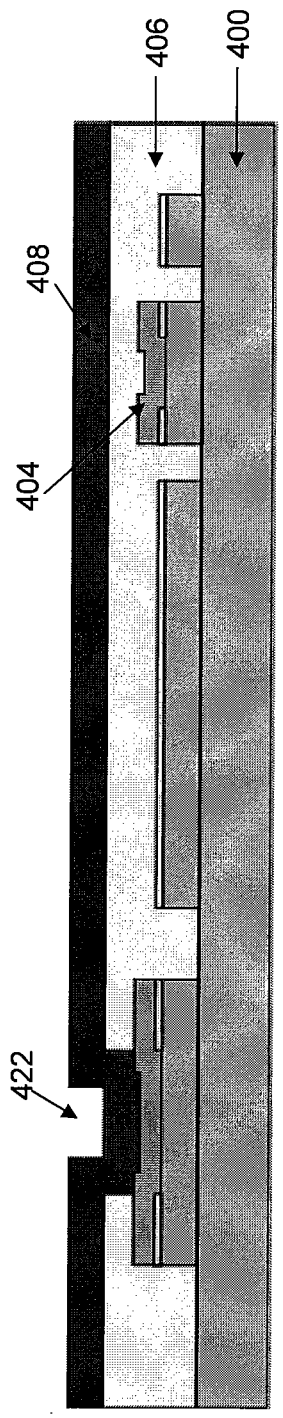
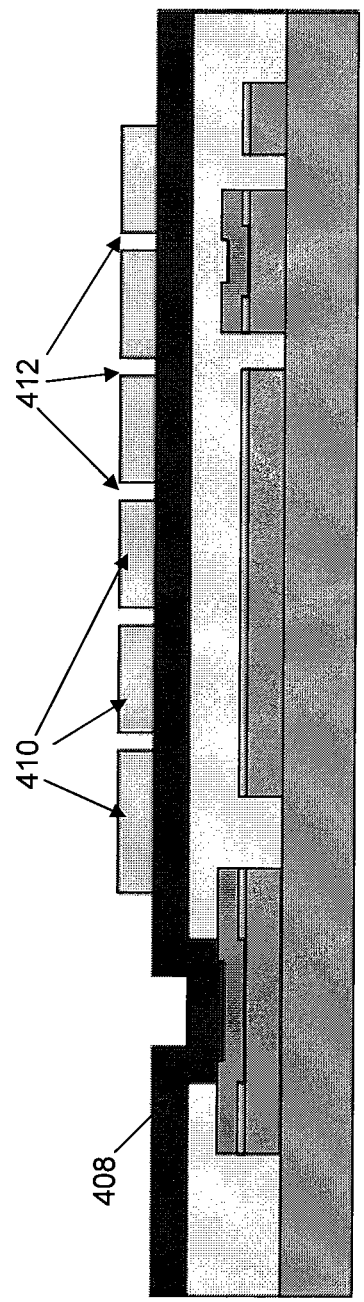
Figure 4A
Figure 4B

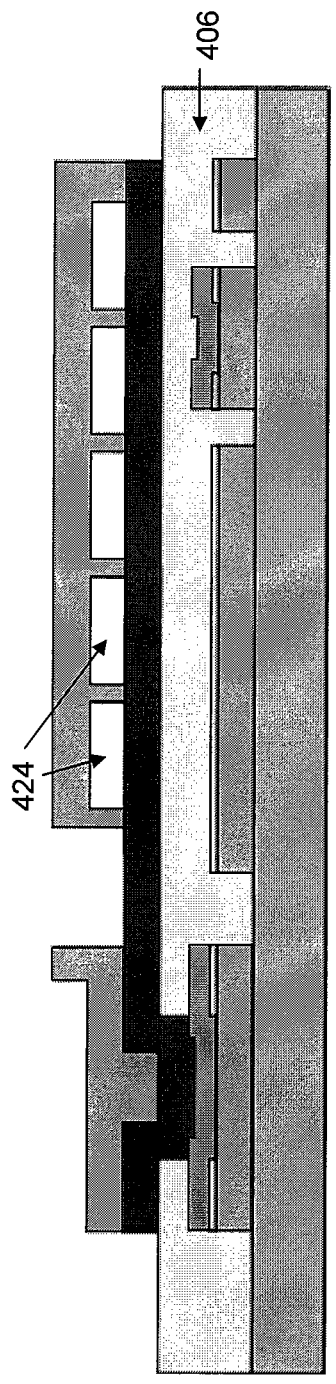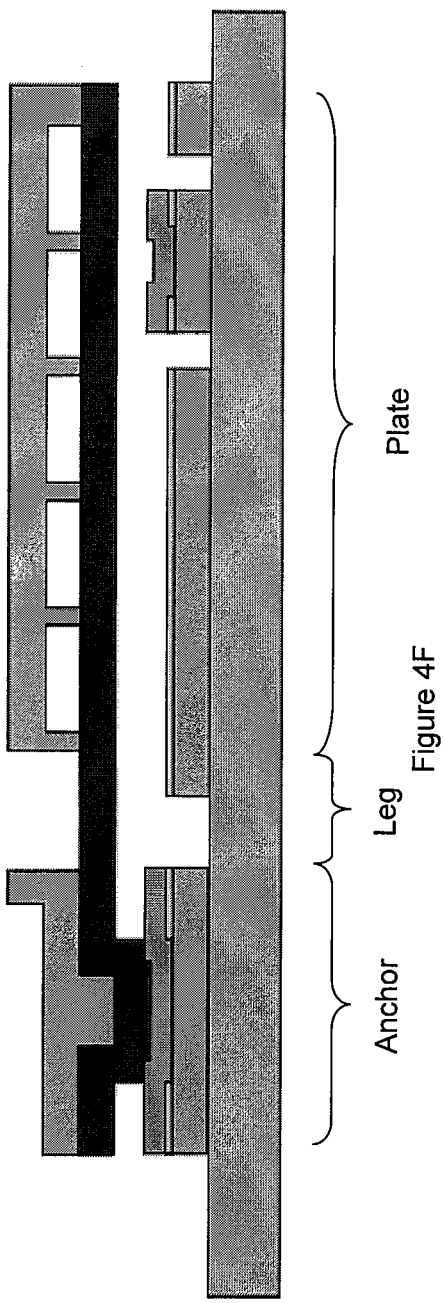

FABRICATION OF MEMS BASED CANTILEVER SWITCHES BY EMPLOYING A SPLIT LAYER CANTILEVER DEPOSITION SCHEME

BACKGROUND OF THE INVENTION

1. Field of the Invention

Embodiments of the present invention generally relate to a method of forming micro-electromechanical system (MEMS) based cantilever switches within an aluminum or copper back end of the line (BEOL) system or any semiconductor process having a metal interconnect system.

2. Description of the Related Art

For MEMS cantilever switches the gradient stress through the beam requires stringent control to prevent significant curvature upon release. Curvature of the beam is when the beam does not return to its normal position prior to contact with an electrode. The beam remains close to the electrode and thus the power necessary to move the beam into contact with the electrode may change.

When the beam develops curvature, the switch may not operate according to its designed parameters. For example, when the beam develops a curvature, the beam remains closer to the contact electrode. Thus, the amount of power necessary to pull the beam into contact with the electrode may be reduced. The switch or beam may therefore be brought into contact with the contact electrode inadvertently. Additionally, because the beam has a curvature, the switch may not operate in a predictable manner. Without knowing the curvature and the power necessary to pull the beam into contact with the contact electrode, control of the switch may be erratic. The curvature in the beam can force the switch to move up or down with respect to the normal position (i.e., the ideal case). Therefore, the voltage required to make the device move from the initial starting position with respect to the normal position can change.

The curvature specification becomes significant as the beam thickness is reduced below 200 nm due to the increasing effect of compressive stress relative to the natural columnar grain structure of the material. The use of refractory materials, such as TiN, to form these very thin cantilever beams exhibit significant gradient stress in the deposited film due to the manner in which the film nucleates and grown upon the wafer surface. In order to tightly control this gradient stress, stringent deposition control parameters are required.

Therefore, there is a need for MEMS cantilever switch that overcomes the gradient stress and a method of its manufacture.

SUMMARY OF THE INVENTION

Embodiments discussed herein generally disclose novel alternative methods that can be employed to overcome the gradient stress formed in refractory materials to be used for thin film MEMS cantilever switches. The use of a 'split layer' cantilever fabrication method, as described herein enables thin film MEMS cantilever switches to be fabricated resulting in low operating voltage devices while maintaining the mechanical rigidity of the landing portion of the final fabricated cantilever switch.

In one embodiment, a micro-electromechanical device fabrication method includes depositing a first conductive layer over a substrate and patterning the first conductive layer to expose one or more portions of the substrate and form a first electrical contact and a contact electrode. The method may also include depositing a first sacrificial layer over the first electrical contact, the contact electrode, and the one or more exposed portions of the substrate. The first sacrificial layer may be patterned to expose the first electrical contact. A second conductive layer may be deposited over the first sacrificial layer and in contact with the first electrical contact. The insulating layer may be patterned to expose portions of the second conductive layer such that a remaining portion of the insulating layer is laterally spaced from a location where the second conductive layer contacts the first electrical contact. The method may also include depositing a reinforcing layer over the second conductive layer and the remaining portion of the insulating layer and patterning both the reinforcing layer and the second conductive layer to expose the remaining portion of the insulating layer and form a beam structure. The method may also include removing at least some of the remaining portion of the insulating layer and removing the first sacrificial layer.

In another embodiment, a micro-electromechanical device fabrication method includes depositing a first conductive layer over a substrate and patterning the first conductive layer to expose one or more portions of the substrate and form a first electrical contact and a contact electrode. The method may also include depositing a first sacrificial layer over the first electrical contact, the contact electrode, and the one or more exposed portions of the substrate and patterning the first sacrificial layer to expose the first electrical contact. The method may also include depositing a second conductive layer over the first sacrificial layer and in contact with the first electrical contact and patterning the second conductive layer to form a beam structure. The method may also include depositing a reinforcing layer over the beam structure and patterning the reinforcing layer to expose a portion of the beam structure laterally spaced from a location where the beam structure contacts the first electrical contact. The method may also include removing the first sacrificial layer.

In another embodiment, a micro-electromechanical device fabrication method includes depositing a first conductive layer over a substrate and patterning the first conductive layer to expose one or more portions of the substrate and form a first electrical contact and a contact electrode. The method may also include depositing a first sacrificial layer over the first electrical contact, the contact electrode, and the one or more exposed portions of the substrate and patterning the first sacrificial layer to expose the first electrical contact. The method may also include depositing a second conductive layer over the first sacrificial layer and in contact with the first electrical contact and patterning the second conductive layer to expose the first sacrificial layer and form a first beam portion in contact with the first electrical contact and a second beam portion separate from and spaced from the first beam portion, the second beam portion disposed over the contact electrode. The method may also include depositing a reinforcing layer over the first beam portion, the second beam portion, and the exposed first sacrificial layer and patterning the reinforcing layer to form a patterned reinforcing layer that is in contact with the first beam portion and the second beam portion and spans a distance between the first beam portion and the second beam portion. The method may also include removing the first sacrificial layer.

In another embodiment, a micro-electromechanical device fabrication method includes depositing a first conductive layer over a substrate and patterning the first conductive layer to expose one or more portions of the substrate and form a first electrical contact and a contact electrode. The method may also include depositing a first sacrificial layer over the first electrical contact, the contact electrode, and the one or more exposed portions of the substrate and patterning the first sacrificial layer to expose the first electrical contact. The method may also include depositing a second conductive layer over the first sacrificial layer and in contact with the first electrical contact and patterning the second conductive layer to form a beam structure. The method may also include depositing a second sacrificial layer over the beam structure and patterning the second sacrificial layer to form a plurality of spacer structures laterally spaced from a location where the beam structure contacts the first electrical contact. The method may also include depositing a reinforcing layer over the beam structure and the plurality of spacer structures and patterning the reinforcing layer to expose a portion of the beam structure laterally spaced from a location where the beam structure contacts the first electrical contact and laterally spaced from the plurality of spacer structures. The method may also include removing the spacer structures such that at least one portion of the patterned reinforcing layer is vertically spaced from the beam structure and removing the first sacrificial layer.

In another embodiment, a micro-electromechanical device is disclosed. The device may include a first electrical contact disposed over a substrate and a contact electrode disposed over the substrate and laterally spaced from the first electrical contact. The device may also include a conductive beam structure having an anchor portion in contact with the first electrical contact, a leg portion, and a plate portion, the plate portion vertically spaced from the contact electrode. The device may also include a first reinforcement element coupled to the anchor portion. The device may also include a second reinforcement element coupled to the plate portion and laterally spaced from the first reinforcement element such that a gap is present between the first reinforcement element and the second reinforcement element over the leg portion.

In another embodiment, a micro-electromechanical device is disclosed. The device may include a first electrical contact disposed over a substrate and a contact electrode disposed over the substrate and laterally spaced from the first electrical contact. The device may also include a conductive anchor element in contact with the first electrical contact and a conductive plate element vertically spaced from the contact electrode and laterally spaced from the anchor element. The device may also include a reinforcement element coupled to the anchor element and the plate element and spanning a distance between the anchor element and the plate element.

In another embodiment, a micro-electromechanical device is disclosed. The device includes an anchor portion having a first rigidity, a leg portion coupled to the anchor portion and having a second rigidity less than the first rigidity, and a plate portion coupled to the leg portion and having a third rigidity greater than the second rigidity. The device may also include one or more layers that span across the plate portion, the leg portion, and the anchor portion to couple the plate portion, the leg portion, and the anchor portion together.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2D are schematic cross sectional views of a cantilever structure at various fabrication stages according to another embodiment.

FIGS. 4A-4F are schematic cross sectional views of a cantilever structure at various fabrication stages according to another embodiment.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments discussed herein generally disclose novel alternative methods that can be employed to overcome the gradient stress formed in refractory materials to be used for thin film MEMS cantilever switches. The use of a 'split layer' cantilever fabrication method, as described herein enables thin film MEMS cantilever switches to be fabricated resulting in low operating voltage devices while maintaining the mechanical rigidity of the landing portion of the final fabricated cantilever switch. Embodiments discussed herein describe the formation of a MEMS cantilever switch in a complementary metal oxide semiconductor (CMOS) BEOL.

The device may be formed at any point within the structure. For example, the device may be formed above or below a CMOS structure. Additionally, the device may be formed within a stack such that additional layers of the structure (i.e., not the device) may be present above the device. The device may be used in the BEOL processing of a metal system. The device may also be formed in the back end of line of any other semiconductor front end technology, such as a bipolar process, or a bi-CMOS, or a SiGe, or a GaAs, GaAlAs or other III/V or II/VI, or any other front end semiconductor process. In one embodiment, the device may be formed on glass.

FIGS. 1A-1F are schematic cross sectional views of a cantilever structure at various fabrication stages according to one embodiment. The embodiment shows a method to fabricate a 'split layer' cantilever switch in an aluminium BEOL flow. It is to be understood that the embodiment can be fabricated in any BEOL flow having a metal interconnect system.

Figure 1A:
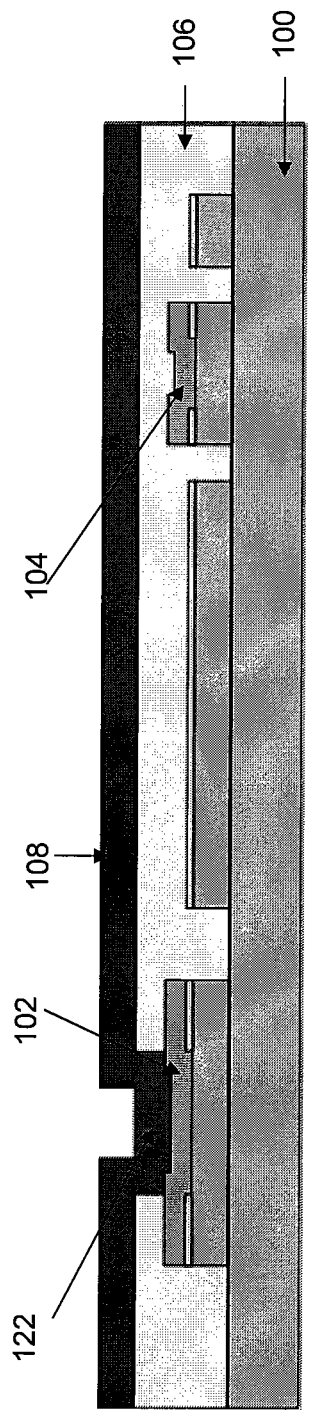
FIGS. 1A-1F are schematic cross sectional views of a cantilever structure at various fabrication stages according to one embodiment.

The first step in the fabrication sequence is illustrated in FIG. 1A. A conductive layer is initially deposited and patterned to form an electrical contact 102 and a contact electrode 104 over a substrate 100. In one embodiment, the conductive material may comprise a metal, metal alloy, or metal compound. In another embodiment, the conductive material may comprise titanium nitride.

A sacrificial layer 106 is then deposited and patterned. The sacrificial layer may be deposited by a process such as plasma enhanced chemical vapour deposition (PECVD), chemical vapour deposition (CVD), spin on technologies, and physical vapour deposition (PVD) to name a few. In one embodiment, the sacrificial layer 106 may comprise a silicon containing compound. In another embodiment, the sacrificial layer 106 may comprise silicon dioxide. In another embodiment, the sacrificial layer 160 may comprise spin on glass. The sacrificial layer 106 may contain a via 122 to connect it to a prior layers. It is to be understood that the via connection may come from a layer above.

A conductive layer 108 may then deposited over a sacrificial layer 106. In one embodiment, the conductive layer 108 may comprise titanium nitride. The material for this layer is not limited to titanium nitride but could also be fabricated from another non-oxidizing material that offers a controlled resistivity for contact MEMS devices. The conductive layer 108 may be selected from the group of materials comprising Al, Cu, Ti, TiN, Ta, TaN, Ru, Pt, WN, WNC or any combination thereof. However, in the case of capacitively coupled MEMS devices the use of a material that forms an oxidised surface when exposed to air may be employed. The conductive layer 108, after patterning, will form what is known as the 'thin'' part of the 'split layer' cantilever. The thickness ratio of the thin to thick layers in the 'split layer' cantilever are tuneable to set the device's operating performance. The conductive layer 108 may be deposited by well known deposition methods such as PVD.

In one embodiment, the conductive layer 108 is patterned by depositing a photoresist layer thereon, exposing the photoresist, developing the photoresist, removing the developed (or undeveloped photoresist) to form a mask, and then exposing the conductive layer through the mask to an etching gas or liquid to remove undesired portions of the conductive layer. Thereafter, the mask may be removed. In one embodiment, a hard mask may be used. In one embodiment, the etching gases or liquids may comprise hydrogen, fluorine, oxygen, hydrogen fluoride, chlorine, hydrochloric acid, nitrogen, helium, xenon difluoride, anhydrous hydrogen fluoride, fluorine based etching gases or liquids, oxygen based etching gases or liquids, hydrogen based etching gases or liquids, or combinations thereof. In another embodiment, the conductive layer 108 is patterned at a later point when the reinforcing material is patterned.

Figure 1B:
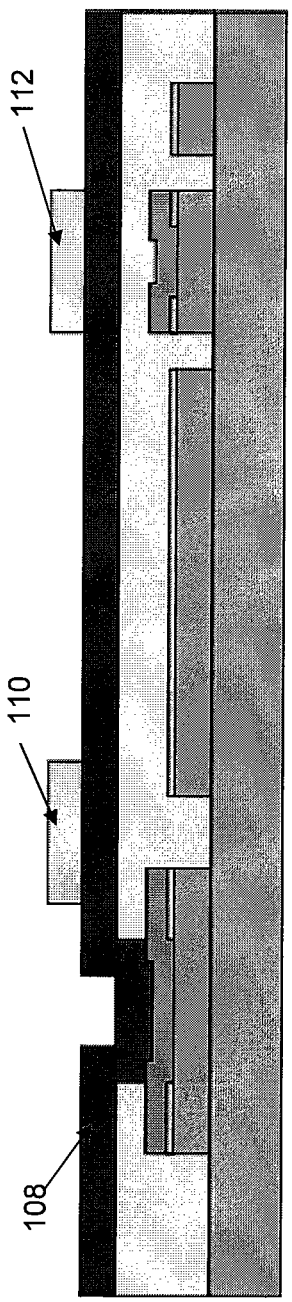

The next step in the fabrication sequence is illustrated in FIG. 1B. Another sacrificial layer may be deposited and patterned over the conductive layer 108. In the embodiment shown in FIG. 1B, the sacrificial layer is deposited prior to patterning the conductive layer 108, but it is to be understood that the conductive layer 108 may be patterned prior to depositing the sacrificial layer. The insulating layer 110 may be patterned by etching the sacrificial layer without attacking the conductive layer 108. In one embodiment, the sacrificial layer may be an insulating material. The sacrificial layer may be deposited, patterned and etched on the surface of the first conductive layer 108. In one embodiment, the sacrificial layer may comprise silicon nitride. In another embodiment, the sacrificial layer may comprise silicon dioxide. In another embodiment, the sacrificial layer may comprise amorphous carbon. In another embodiment, the sacrificial layer may comprise a spin on organic film. Other potential sacrificial layers which can be include organic, polyimide, and amorphous-carbon. In one embodiment, the sacrificial layer may be deposited by PECVD. In one embodiment, the sacrificial layer may be etched using a fluorine plasma based etch, a hydrogen or oxygen plasma etch, a wet HF etch, a vapour HF or a vapour HF etch to name a few. The thickness of the sacrificial layer needs to be sufficient to prevent dimensional loss in both the horizontal and vertical planes during the final cantilever etch. After patterning, the sacrificial layer that remains is an insulating material 110 over the area of conductive layer 108 that will eventually comprise the leg of the split-layer cantilever. A top side bump of insulating material 112 may also be formed, without additional process steps, for the cantilever switch such a bump is used to limit contact area.

The insulating material 110 that remains is used to form the leg portion of the cantilever. The insulating material 110 will eventually be removed so that the leg portion of the cantilever has a predetermined thickness and hence, a predetermined rigidity. By knowing the rigidity of the leg portion, the voltage that is applied to move the cantilever may be more predictable and repeatable. The insulating material 112 is used to create a bump that limits the contact area of the cantilever to an upper electrode. Additionally, the insulating material 112, which provides a bump on the cantilever, will lessen the distance that the cantilever needs to move before it comes into contact with an electrode above the cantilever. Hence, the top side stiction can be predicted and the voltage of the pull up electrode (i.e., an electrode above the cantilever), can be repeated. The insulating material 112 may be laterally spaced from the location where the conductive layer 108 contacts the electrical contact 102. The insulating layer 110 may be laterally spaced from the insulating material 112 and the location where the conductive layer 108 contacts the electrical contact 102.

Figure 1C:
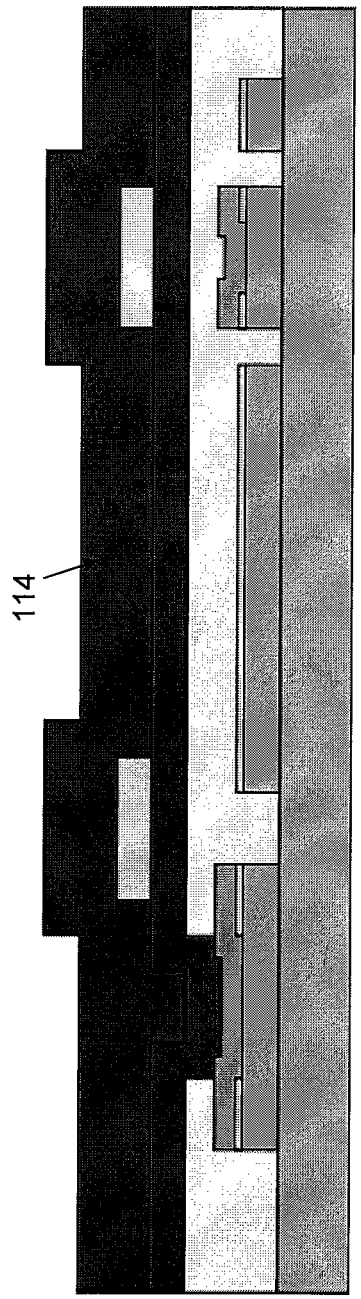

The next step in the fabrication sequence is illustrated in FIG. 1C. A second conductive layer 114 is deposited over the first conductive layer 108 and the remaining insulating material 110, 112 remaining after the etching. In one embodiment, the second conductive layer 114 may comprise titanium nitride. The second conductive layer 114 will be used to form the 'thick' part of the cantilever switch. It is to be understood that the conductive material isn't limited to titanium nitride. Other conducting materials can be used. In one embodiment, the second conductive layer 114 can be replaced with an insulating layer. The second conductive layer 114 may be deposited by well known deposition techniques such as PVD.

Figure 1D:
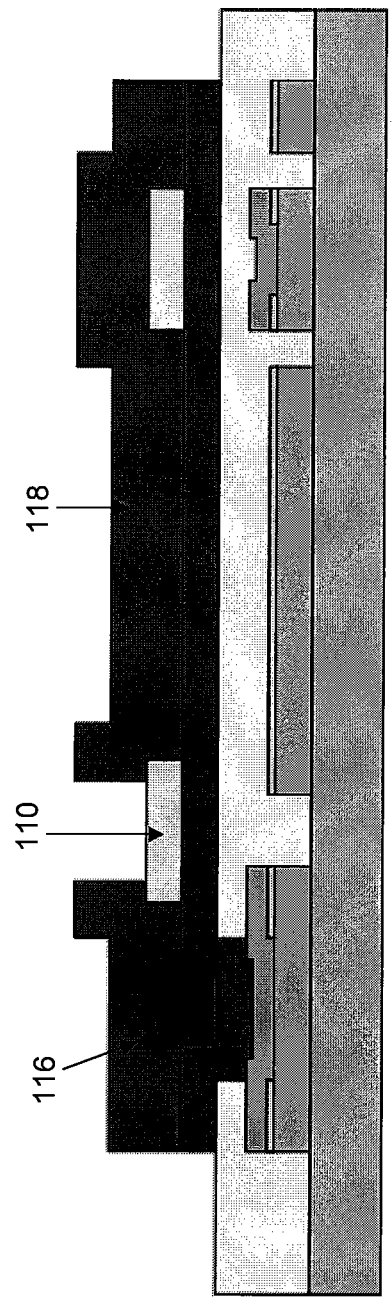

The next step in the fabrication sequence is illustrated in FIG. 1D where the cantilever switch is patterned and etched to form the final device. The second conductive layer 114 is patterned and etched to form a first reinforcing element 116 over and in contact with the electrical contact 102. Patterning the conductive layer 114 also forms a second reinforcing element 118 laterally spaced from the first reinforcing element 116 and laterally spaced from the electrical contact 102. Portions of the second reinforcing element 118 are disposed over the contact electrode 104. The second conductive layer 114 may be etched in a manner similar to the etching performed for patterning the first conductive layer 108 discussed above. The first conductive layer 108 may be patterned along with the second conductive layer 114 in the same step. Patterning the second conductive layer 114 also exposes the insulating material 110 that is laterally spaced from the electrical contact 102. The insulating material 110 acts as an etch stop during the metal etch of the second conductive layer 114 to form self aligned legs in the 'thin'/lower part of the cantilever. During the pattering of the second conductive layer 114, the first conductive layer 108 may also be patterned to form the beam 120. The second reinforcing element 118 spaced from the first reinforcing element 116 and disposed over the contact electrode 104. In one embodiment, the first reinforcing element 116 has a length less than a length of the second reinforcing element 118. In another embodiment, the first reinforcing element 116 is spaced from the second reinforcement element 118 by a distance less than a length of the first reinforcement element 116.

Figure 1E:
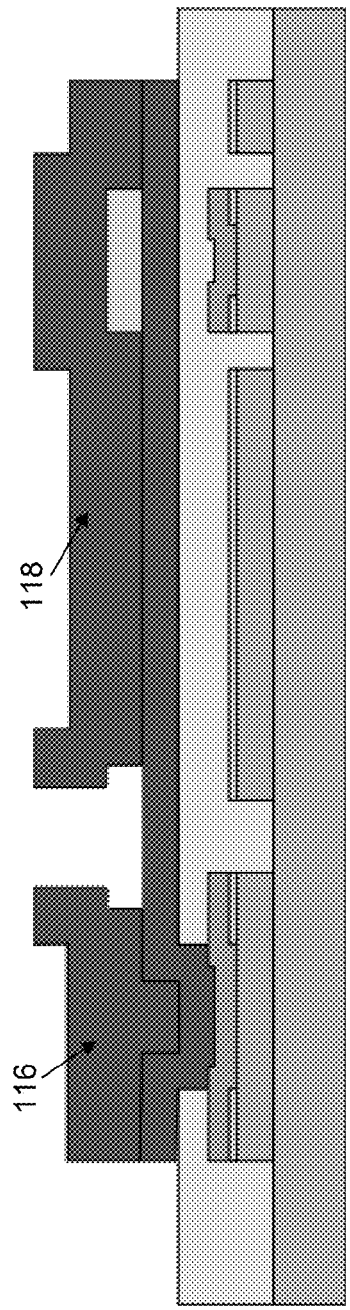

The insulating material 110 may then be removed by etching as shown in FIG. 1E. In one embodiment, the insulating material 110 is exposed to a fluorine based plasma to etch the insulating material 110. Although not shown, it is to be understood that the insulating material 112 may also be removed if desired.

Figure 1F:
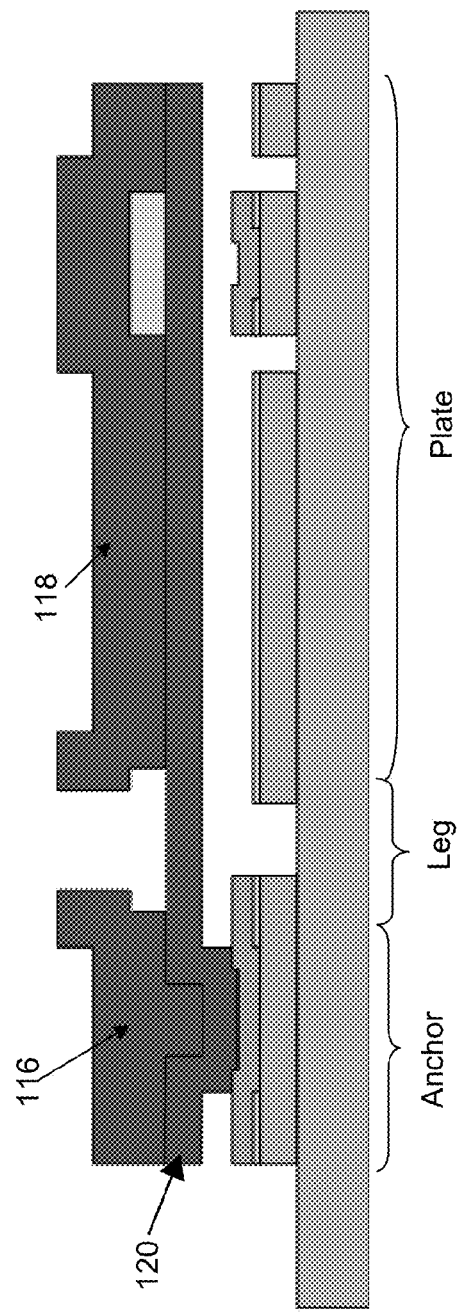

The final structure is shown in FIG. 1F. The three key features of the final device are shown, namely the anchor, thin leg and switch plate. The sacrificial layer 106 has been removed to free the 'split-layer' cantilever. The sacrificial layer 106 may be removed by a plasma etch. It is to be understood that the removal of the sacrificial layer 106 is material dependent. In one embodiment, the etching gases or liquids may comprise hydrogen, fluorine, oxygen, hydrogen fluoride, chlorine, hydrochloric acid, nitrogen, helium, xenon difluoride, anhydrous hydrogen fluoride, fluorine based etching gases or liquids, oxygen based etching gases or liquids, hydrogen based etching gases or liquids, or combinations thereof.

By optimising the ratio of the thin and thick deposition thicknesses, the electromechanical performance of the device can be optimized. A key component of this is the voltage differential between landing on the designated contact and another part of the electrode surface, known as secondary landing 124. Secondary landings are device dependent and can occur in different locations on the bottom electrode surface. Secondary landing location 124 is just one example of a secondary location. It is to be understood that the secondary landing location is not to be limited to the location shown. By adjusting the relative stiffness of the leg and plate components of the cantilever this voltage differential can be increased to a point where the secondary landing voltage is significantly greater than the underlying CMOS can supply.

With DC magnetron sputter deposition of metals, and in the case of a refractory metal used for the cantilever illustrated, gradient stresses build up in the film as it grows. By having a thin, easily bent initial layer to form the leg and a thick slab in a ratio of greater than about 1:2 thin to thick, for example, the gradient stress formed in the thin section isn't allowed to dominate the final induced curvature of the released structure resulting in a planar switching plate. The effect of thin/thick in terms of mechanical rigidity is illustrated in Table 1. As the ratio of thin leg to total plate thickness increases the impact of the gradient stress in the thin leg is significantly reduced making it insignificant in the final mechanical performance of the device. The thin value is the value for the leg portion of the cantilever. The thick value is the value for the plate portion of the cantilever. The total valve is the sum of the thin value and the thick value. The rigidity ratio is a ratio of the thin value relative to the cubed total value. For example, for a leg portion of a cantilever having a thickness of 1 nm and a plate portion of the cantilever having a thickness of 2 nm, the rigidity ratio is 1:27 which means that the plate portion is 27 times stiffer than the leg portion. It is to be understood that the ratio is essentially unitless. Additionally, the rigidity may be affected by the width (i.e., the distance into the paper in the Figures) of the cantilever.

TABLE 1

Mechanical rigidity performance of thin/thick cantilever devices.

| Thin | Thick | Total | Rigidity Ratio |
|------|-------|-------|----------------|
| 1    | 1     | 2     | 1:8            |
| 1    | 2     | 3     | 1:27           |
| 1    | 3     | 4     | 1:64           |
| 1    | 4     | 5     | 1:125          |
| 1    | 5     | 6     | 1:216          |
| 1    | 6     | 7     | 1:343          |

Figure 2A:
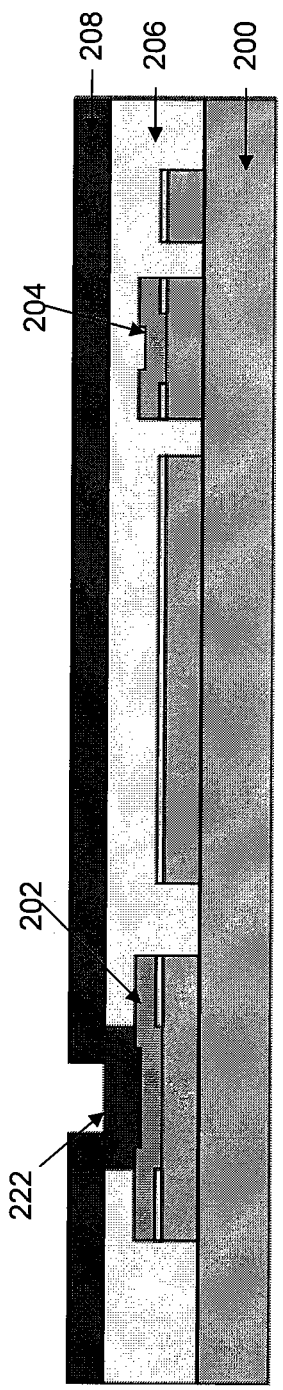

FIGS. 2A-2D are schematic cross sectional views of a cantilever structure at various fabrication stages according to another embodiment. In this implementation, the second, 'thick' layer of the cantilever is fabricated from a material that can be etched without etching the cantilever material, which can be an insulating material such as $SiO_2$. The starting fabrication sequence is identical to the first embodiment, as shown in FIG. 2A, where the thin layer of the cantilever is deposited. The conductive layer 208 is deposited over a sacrificial layer 206 having a via 222 therethrough to an electrical contact 202. The sacrificial layer 206 may be formed over a contact electrode 204 and a substrate 200.

Figure 2B:
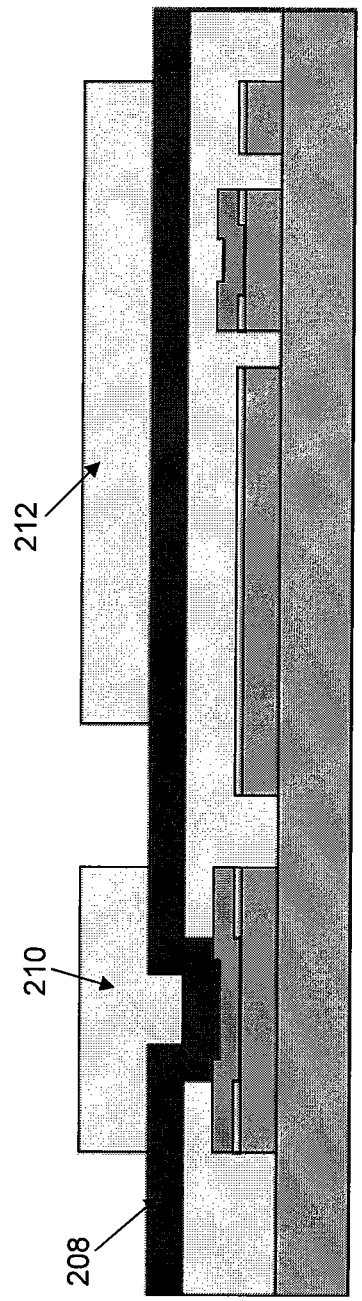

The second step, FIG. 2B, comprised of the 'thick' layer deposition, an insulating layer may be deposited and patterned to form the anchor part 210 and plate part 212 of the cantilever switch. In one embodiment, the insulating layer may comprise silicon dioxide. The anchor part 210 may be in contact with the conductive layer 208 and laterally spaced from the plate part 212. The plate part 212 may be disposed over the contact electrode 204. Thereafter, the conductive layer 208 may be patterned to form the beam 214. The sacrificial layer 206 may then be removed.

Figure 3A:
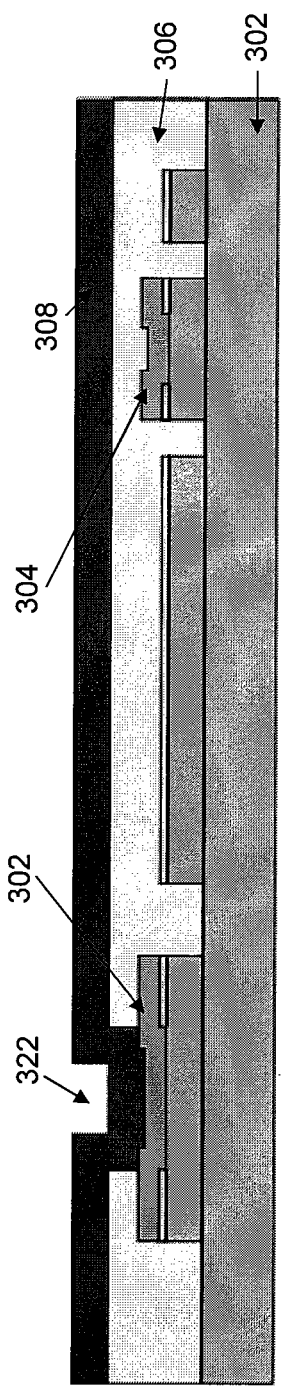
FIGS. 3A-3D are schematic cross sectional views of a cantilever structure at various fabrication stages according to another embodiment.
Figure 3B:
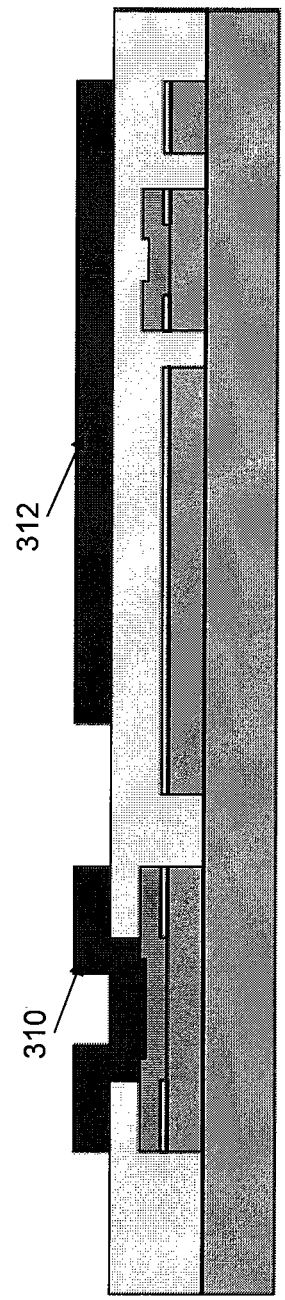
Figure 3C:
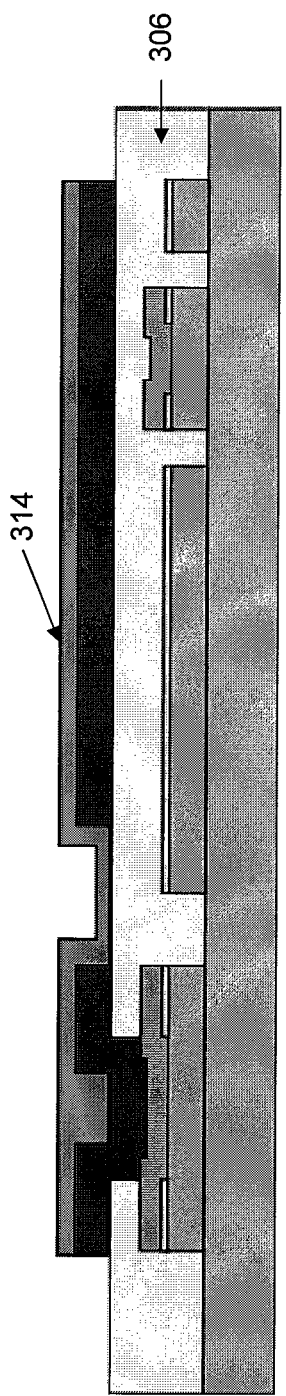

FIGS. 3A-3D are schematic cross sectional views of a cantilever structure at various fabrication stages according to another embodiment. In this instance, the deposition sequence of the 'thin' and 'thick' layers is reversed. The first layer to be deposited is the 'thick' layer as shown in FIG. 3A. The conductive layer 308 is deposited over a sacrificial layer 306 having a via 322 therethrough to an electrical contact 302. The sacrificial layer 306 may be formed over a contact electrode 304 and a substrate 300.

The conductive layer 308 is then patterned and etched to form an anchor element 310 and a plate element 312. The anchor element 310 is in contact with the electrical contact 302 and disposed thereover. The anchor element 310 is laterally spaced from the plate element 312. The plate element 312 is disposed over the contact electrode 304.

Figure 3D:
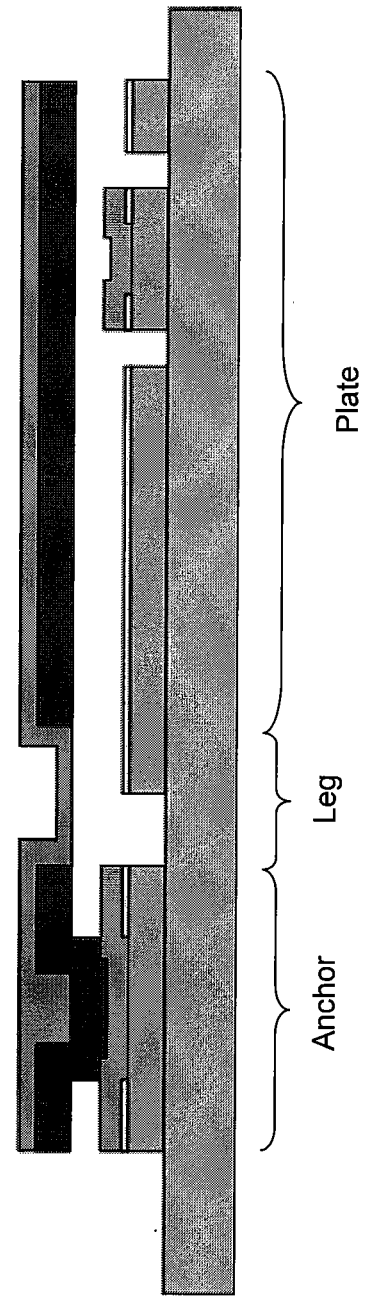

After the anchor element 310 and plate element 312 are formed, a 'thin' layer or second layer is deposited and patterned to form a reinforcing element 314 that spans a gap between the anchor element 310 and the plate element 312. Thereafter, as shown in FIG. 3D, the sacrificial layer 306 may be removed. The structure showing the anchor, leg, and plate of the cantilever switch is shown in FIG. 3D.

Figure 4C:
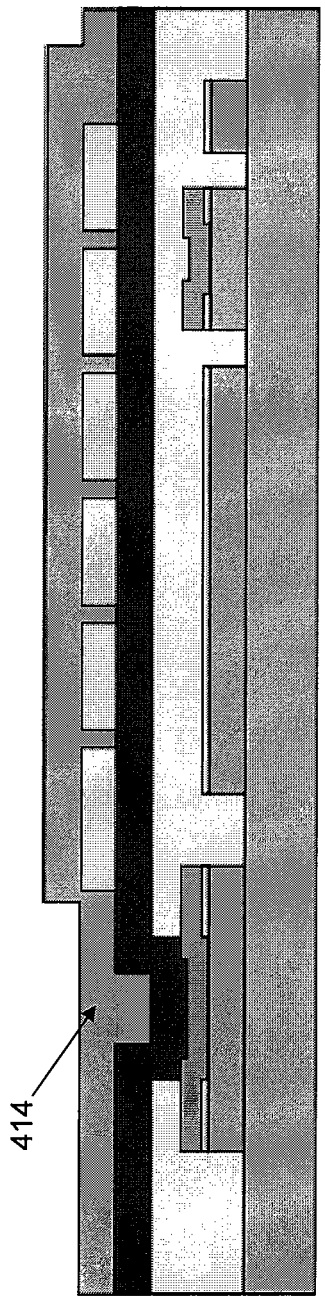
Figure 4D:
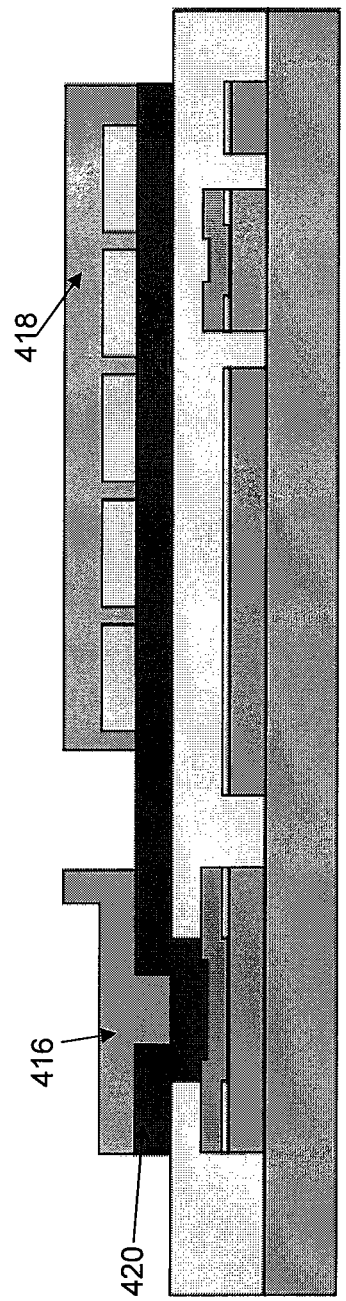

FIGS. 4A-4F are schematic cross sectional views of a cantilever structure at various fabrication stages according to another embodiment. This implementation has two 'thin' layers held together with a honeycomb like structure. As shown in FIG. 4A, a conductive layer 408 is deposited over a sacrificial layer 406 having a via 422 therethrough to an electrical contact 402. The sacrificial layer 406 may be formed over a contact electrode 404 and a substrate 400. A second sacrificial layer may be deposited over the conductive layer 408. The second sacrificial layer may then be patterned and etched to form a plurality of spacer structures 410 with vias 412 therebetween. In one embodiment, the sacrificial layer 406 may comprise a spin on dielectric layer. Other materials that may be used include silicon, silicon nitride, organic material, polyimide, amorphous carbon, and silicon dioxide. The sacrificial layer 406 may be deposited by various methods such as spin on, PVD, CVD, PECVD, ALD, and other well known deposition methods.

Thereafter, a second conductive layer 414 may be deposited and patterned. The second conductive layer 414 may be deposited into the vias 412 such that the second conductive layer 414 fills the vias 412 and is in contact with the first conductive layer 408. The first conductive layer 408 may also be patterned to form a beam 420. During the second conductive layer 414 patterning, a portion of the beam 420 may be exposed. After the etching, an anchor portion 416 and a plate portion 418 of the second conductive layer 414 may remain. The anchor portion 416 may be disposed over and in contact with the beam 420 at a location disposed over the electrical contact 402. The plate portion 418 may be laterally spaced from the anchor portion 416 and disposed above and in contact with the beam 420.

The spacer structures 410 may then be removed. The sacrificial layer 406 may also be removed. The spacer structures 410 and the sacrificial layer 406 may be removed in the same etching step. In one embodiment, the spacer structures 410 and the sacrificial layer 406 may be removed using separate etching steps. When the spacer structures 410 are removed, portions of the plate portion 418 are spaced from the beam 420 by gaps 424 while other portions are in contact with the beam 420. The spacer structures 410 create a honeycomb, honey-comb-like, waffle, or waffle-like structure that provides a mechanical stiffness.

The split layer cantilever discussed in the embodiments shown herein have an anchor portion that couples the cantilever to a structure below, a leg portion where the cantilever bends, and a plate portion that ultimately contacts the electrodes. The plate portion and the anchor portion each are thicker than the leg portion. Thus, the plate portion and the anchor portion each have a greater rigidity than the leg portion. The leg portion, due to its greater flexibility than the anchor and plate portions, will be the location where the cantilever will be expected to bend.

Due to the bending occurring at the leg, the location where the plate lands can be better controlled and predicted. When the location of the plate landing is known, the voltage used to pull down the plate (or pull up the plate) is predictable and repeatable. Additionally, due to the increased thickness of the plate relative to the leg, the voltage used to move the cantilever may be reduced as a function of the leg rigidity.

A split layer cantilever may reduce the stringent deposition control parameters required to control cantilever curvature (i.e., gradient stress) for thin film refractory materials, such as titanium nitride. Additionally, a split layer cantilever may improve the mechanical performance of the device. By having a thin leg section and thick plate section, the voltage at which the device secondary lands increases, where the beam touches either down or up to undesired locations on the electrode space, while reducing the operating voltage of the device.

By having a rigid beam with flexible legs all the mechanical benefits can be realized for device operation. The thin leg part of the device enables low voltage operation compared to an equivalent device with a thick leg giving a reduction in operating voltage of >50% depending upon the ratio of the thin to thick parts of the cantilever switch. The choice of materials used reduces the bi-morph/bi-metallic states that can readily form when two materials of dissimilar coefficient of thermal expansion, CTE, are put together. The fabrication process for forming the compliant leg, allows a bump (required to reduce adhesion by reducing the contact area when the cantilever touches the top pull-up electrode) to be produced with no extra processing. The embodiments described herein permit the engineering of materials to fabricate a mechanically sound switch that is pliant where needed and rigid where pliancy is not needed.

While the foregoing is directed to embodiments of the present invention, other and further embodiments of the invention may be devised without departing from the basic scope thereof, and the scope thereof is determined by the claims that follow.

The invention claimed is:

1. A micro-electromechanical device, comprising:
a first electrical contact disposed over a substrate;
a contact electrode disposed over the substrate and laterally spaced from the first electrical contact;
a conductive beam structure having an anchor portion in contact with the first electrical contact, a leg portion, and a plate portion, the plate portion vertically spaced from the contact electrode, the leg portion movable to move the plate portion into contact with the contact electrode;
a first reinforcement element coupled to the anchor portion such that the anchor portion and first reinforcement element are collectively thicker than the leg portion; and
a second reinforcement element coupled to the plate portion and laterally spaced from the first reinforcement element such that a gap is present between the first reinforcement element and the second reinforcement element over the leg portion, and wherein the second reinforcement element and the plate portion collectively are thicker than the leg portion.

2. The device of claim 1, wherein the conductive beam comprises titanium nitride.

3. The device of claim 2, wherein the first reinforcement element and the second reinforcement member each comprise titanium nitride.

4. The device of claim 2, wherein the first reinforcement element comprises an insulating material.

5. The device of claim 1, wherein the second reinforcement element is vertically spaced from the plate portion at one or more first locations and in contact with the plate portion in one or more second locations.

6. The device of claim 1, wherein the first reinforcement element has a length less than a length of the second reinforcement element.

7. The device of claim 6, wherein the first reinforcement element is spaced from the second reinforcement element by a distance less than a length of the first reinforcement element.

8. A micro-electromechanical device, comprising:
an anchor portion having a first rigidity;
a leg portion coupled to the anchor portion and having a second rigidity less than the first rigidity;
a plate portion coupled to the leg portion and having a third rigidity greater than the second rigidity; and
one or more layers that span across the plate portion, the leg portion, and the anchor portion to couple the plate portion, the leg portion, and the anchor portion together, the one or more layers comprising a conductive layer.

9. The device of claim 8, wherein the one or more layers comprise titanium nitride.

10. The device of claim 8, wherein the one or more layers additionally comprise an insulating layer.

11. The device of claim 8, wherein the leg portion consists of the one or more layers and has a thickness that is less than the thickness of the plate portion.

12. A micro-electromechanical device, comprising:
a first electrical contact disposed over a substrate;
an electrode disposed over the substrate and laterally spaced from the first electrical contact;
a conductive beam structure having an anchor portion in contact with the first electrical contact, a leg portion, and a plate portion, the plate portion vertically spaced from the electrode, and the leg portion movable to move the plate portion into contact with the electrode; and
a reinforcement element coupled to the plate portion such that portions of the reinforcement element are vertically spaced from the conductive beam structure.

13. The device of claim 12, wherein the conductive beam structure comprises titanium nitride.

14. The device of claim 13, wherein the reinforcement element comprises titanium nitride.

15. The device of claim 13, wherein the reinforcement element comprises an insulating material.

16. The device of claim 12, wherein the plate portion is a waffle shaped structure.

17. The device of claim 12, wherein the leg portion has a greater flexibility as compared to the plate portion.

18. The device of claim 17, wherein the conductive beam structure comprises titanium nitride.

19. The device of claim 18, wherein the reinforcement element comprises titanium nitride.

* * * * *